(12) United States Patent
Lou et al.

(10) Patent No.: US 9,535,114 B2
(45) Date of Patent: Jan. 3, 2017

(54) TESTING DEVICE

(71) Applicant: STAR TECHNOLOGIES, INC., Hsinshu (TW)

(72) Inventors: Choon Leong Lou, Singapore (SG); Ho Yeh Chen, Hsinchu (TW); Hsiao Ting Tseng, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 281 days.

(21) Appl. No.: 14/092,534

(22) Filed: Nov. 27, 2013

(65) Prior Publication Data

US 2014/0145740 A1    May 29, 2014

Related U.S. Application Data

(60) Provisional application No. 61/730,733, filed on Nov. 28, 2012.

(51) Int. Cl.
*G01R 1/067* (2006.01)
*G01R 31/28* (2006.01)
*G01R 31/26* (2014.01)
*G01R 1/073* (2006.01)

(52) U.S. Cl.
CPC ....... *G01R 31/2886* (2013.01); *G01R 31/2601* (2013.01); *G01R 1/07342* (2013.01)

(58) Field of Classification Search
CPC . G01R 1/067; G01R 1/06711; G01R 1/06733; G01R 1/073
USPC ....................................... 324/754.03, 755.01
See application file for complete search history.

(56) References Cited

U.S. PATENT DOCUMENTS

| | | | | |
|---|---|---|---|---|
| 4,906,920 A | * | 3/1990 | Huff | G01R 1/0735 324/73.1 |
| 5,672,977 A | * | 9/1997 | Yamada | G01R 1/0735 324/754.14 |
| 7,298,155 B2 | * | 11/2007 | Fuchiyama | G01R 31/2886 324/750.26 |
| 2006/0232286 A1 | * | 10/2006 | Lee | G01R 3/00 324/754.03 |

\* cited by examiner

*Primary Examiner* — Jermele M Hollington
*Assistant Examiner* — Robert P Alejnikov, Jr.
(74) *Attorney, Agent, or Firm* — WPAT, P.C., Intellectual Property Attorneys; Anthony King

(57) ABSTRACT

A testing device comprises a first probe member, a second probe member, and an insulation member. The first probe member comprises a tip portion for contacting a device being tested. The second probe member also comprises a tip portion for contacting the device being tested. The insulation member is located at or can be moved to a location between the tip portions of the first and second probe members.

19 Claims, 7 Drawing Sheets

TESTING DEVICE

CROSS-REFERENCE TO RELATED APPLICATION

This patent application claims priority under 35 U.S.C. §119(e) from Provisional Patent Application No.: 61/730,733, filed Nov. 28, 2012, the disclosure of which is incorporated by reference herein in its entirety, including all exhibits appended to Provisional Patent Application No.: 61/730,733.

BACKGROUND

1. Technical Field

The present invention relates to a testing device for testing circuits, and more particularly to a testing device for testing integrated circuits.

2. Related Art

When high voltage semiconductor devices become smaller, air between pads of a device being tested cannot sufficiently prevent the occurrence of an electrical breakdown. Therefore, currents may flow from one testing probe of a tester to another through air or along the surface between corresponding pads of the device being tested, and consequently creating an electric arc which causes damage to the device being tested or the tester performing the testing.

SUMMARY

One embodiment of the present invention discloses a testing device. The testing device comprises a first probe member, a second probe member, and an insulation member. The first probe member comprises a tip portion for contacting a device being tested. The second probe member also comprises a tip portion for contacting the device being tested. The insulation member is located at or can be moved to a location between the tip portions of the first and second probe members.

One embodiment of the present invention discloses a testing device, which comprises a first probe member, a second probe member, and an insulation member. The first probe member comprises a tip portion for contacting a device being tested. The second probe member also comprises a tip portion for contacting the device being tested. The insulation member is positioned in a location between the tip portions of the first and second probe members when a testing is performed.

One embodiment of the present invention discloses a method for testing a circuit. The method comprises moving first and second probe members to contact a device being tested; and increasing a breakdown voltage between the first and second probe members by using an insulation member.

To provide a better understanding of the above-described objectives, characteristics and advantages of the present invention, a detailed explanation is provided in the following embodiments with reference to the drawings.

BRIEF DESCRIPTION OF THE DRAWINGS

The invention will be described according to the appended drawings in which.

DETAILED DESCRIPTION OF DISCLOSED EMBODIMENTS

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

Figure 1:
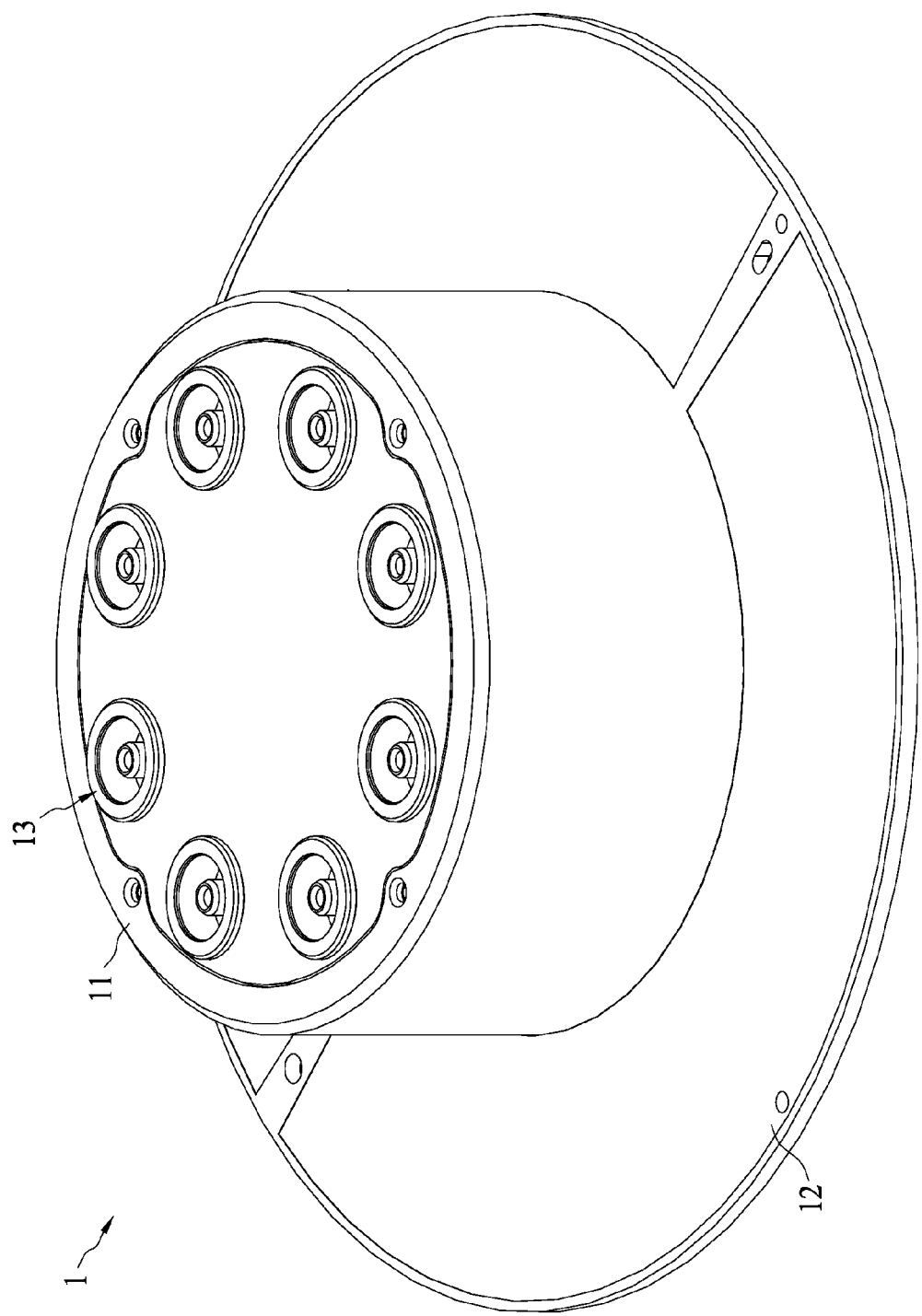
FIG. 1 is a schematic view showing a testing device included in an apparatus for testing circuits, preferably, integrated circuits according to one embodiment of the present invention.
Figure 2:
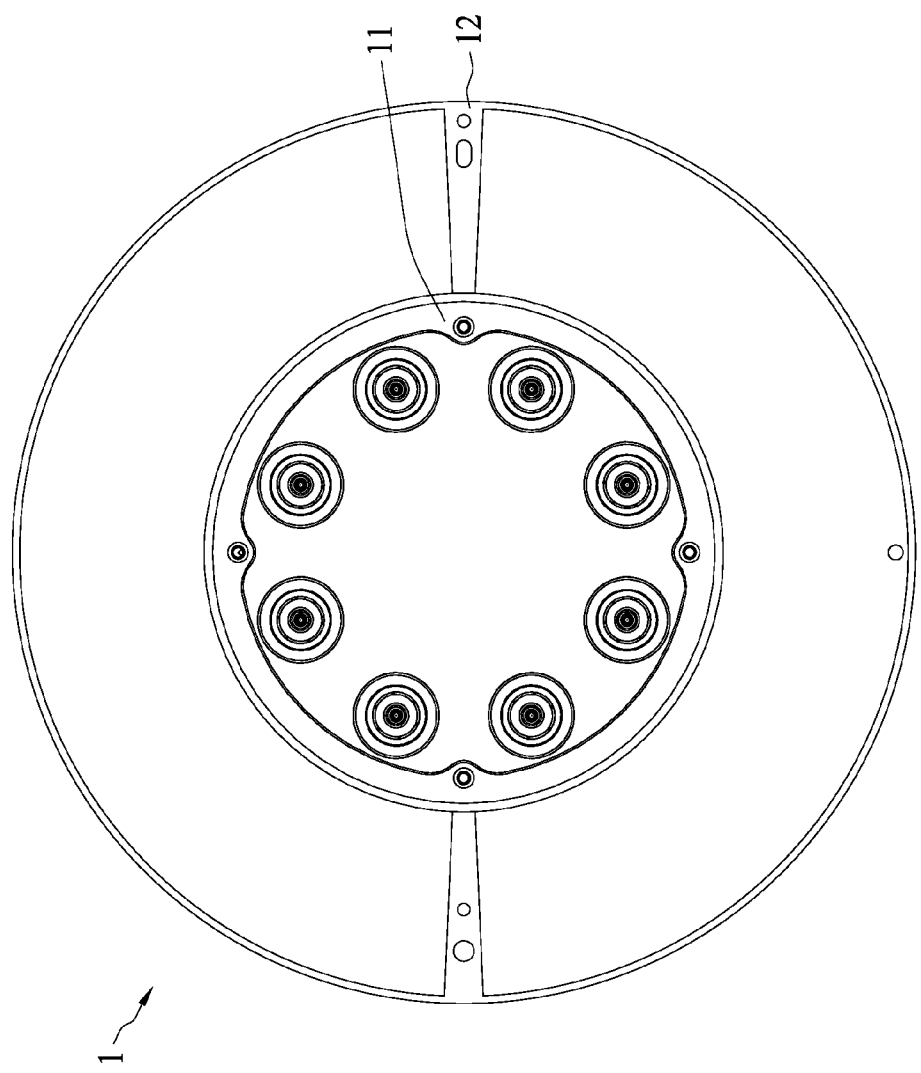
FIG. 2 is a top view showing a testing device according to one embodiment of the present invention.

FIG. 1 is a schematic view showing a testing device 1 included in an apparatus (i.e., a tester) for testing circuits, preferably, integrated circuits according to one embodiment of the present invention. FIG. 2 is a top view showing a testing device 1 according to one embodiment of the present invention. Referring to FIGS. 1 and 2, the testing device 1 is configured for testing circuits, preferably, integrated circuits. The testing device 1 comprises a body portion 11 and a circuit board 12. The body portion 11 can be attached to the circuit board 12. The body portion 11 can hold the circuit board 12. The testing device 1 can have a plurality of connecting element 13 such as, but not limited to, coaxial connectors. The plurality of connecting element 13 may be electrically connected to the circuit board 12. Testing signals and/or measured signals can be transmitted to and from the circuit board 12 through the connecting element 13. The body portion 11 may comprise at least one fixing element such as, but not limited to, screw holes for connecting with a station of the apparatus.

The testing device 1 can be configured for extreme high voltage, current and power tests for semiconductor devices. The testing device 1 can be applied for wafer-level tests at 200 degrees Celsius with an applied voltage of up to 15KV/200 A.

In one embodiment, the circuit board 12 may comprise, but is not limited to, a high-density ceramic board.

In one embodiment, the body portion 11 may be made of metal or non-metal. The body portion 11, preferably, comprises aluminum.

Figure 3:
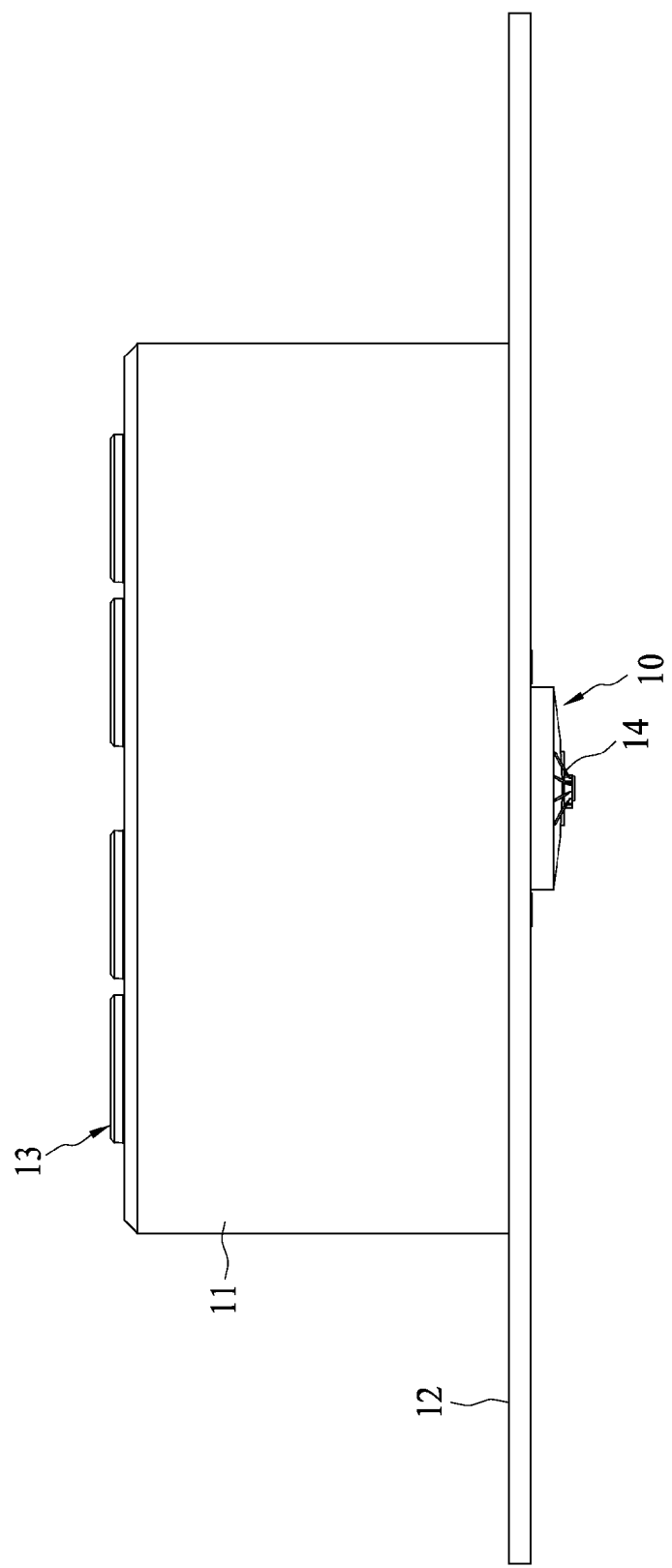
FIG. 3 is a side view showing a testing device according to one embodiment of the present invention.
Figure 4:
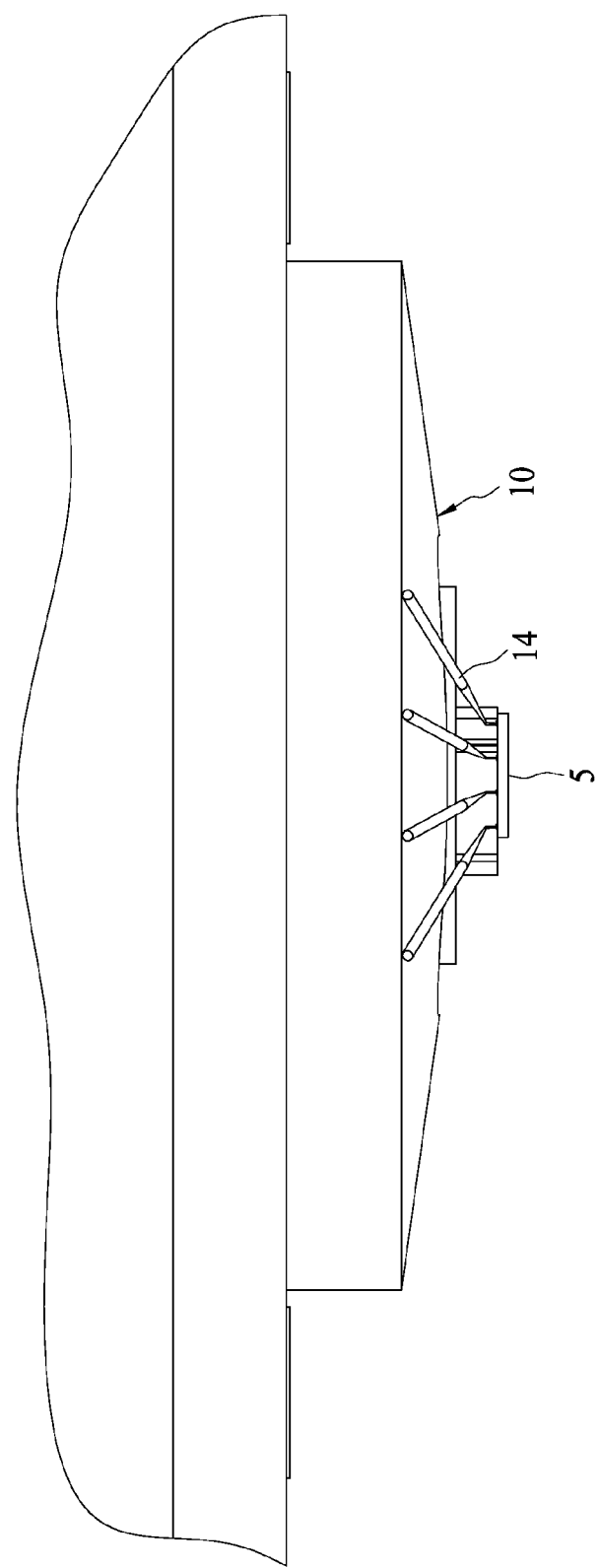
FIG. 4 is a view showing the probe members of a testing device according to one embodiment of the present invention.

FIG. 3 is a side view showing a testing device 1 according to one embodiment of the present invention. FIG. 4 is a view showing the probe members 14 of a testing device 1 according to one embodiment of the present invention. Referring to FIGS. 3 and 4, the testing device 1 may further comprise a plurality of probe members 14 configured for measuring devices being tested. The probe members 14 can electrically connect to the circuit board 12. The probe members 14 can act as bridges between the circuit board 12 and the devices being tested.

The testing device 1 may comprise a holding mechanism 10 in order to restrain the probe members 14.

The probe member 14 may comprise, but is not limited to, a cantilever probe. The probe member 14 can be other commonly used probes as well.

The probe member 14 can be made of Rhenium Tungsten (for Aluminum pads) and of any materials suitable for use in probes. The probe member 14 can also be made of platinum alloy.

Ferrite beads can be provided for the corresponding probe members 14 in order to prevent high-gain devices from oscillating during testing.

Figure 5:
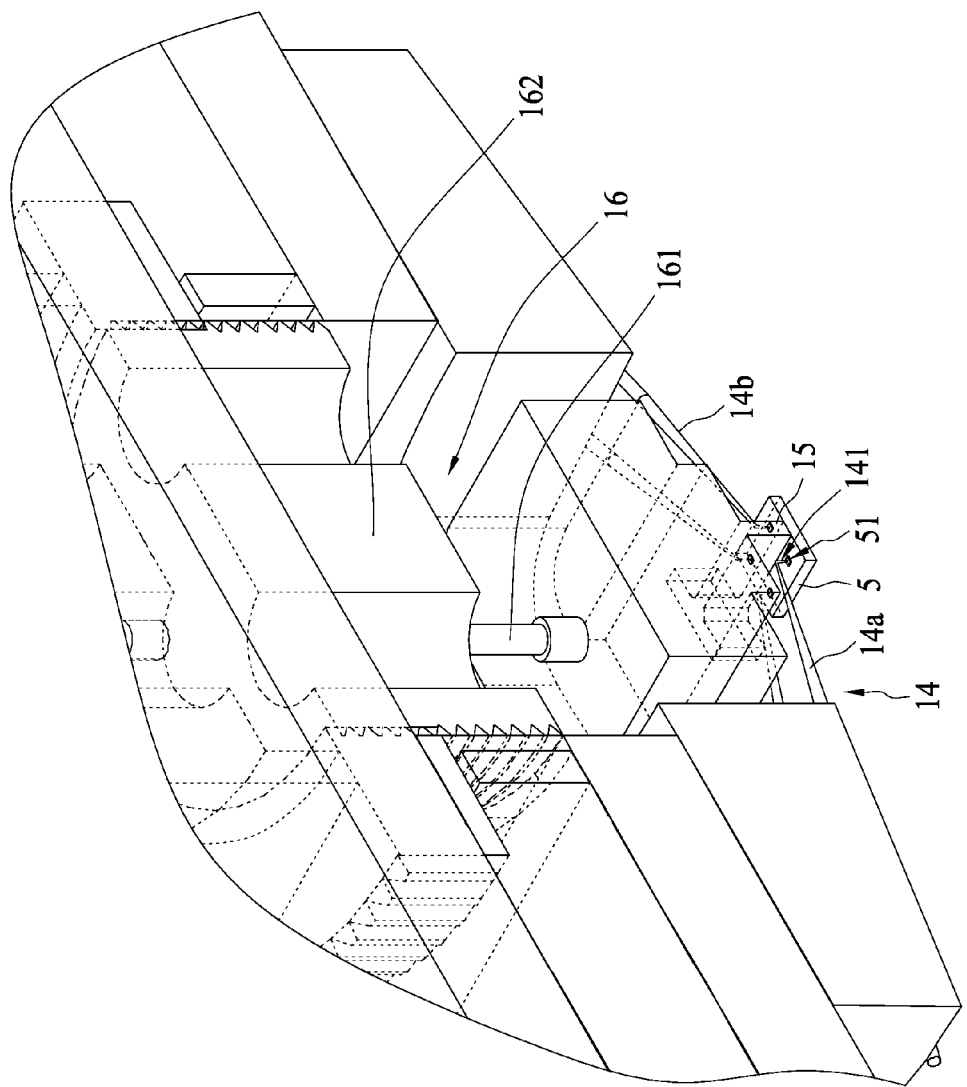
FIG. 5 is a view showing a portion of a testing device 1 according to one embodiment of the present invention.

FIG. 5 is a view showing a portion of a testing device 1 according to one embodiment of the present invention. Referring to FIG. 5, an insulation or barrier member 15 is applied to cut off breakdown paths between a first probe member 14a and a second probe member 14b to prevent the occurrence of an electrical breakdown. In one embodiment, the insulation member 15 can only be applied when air between the first and second probe members 14a and 14b cannot prevent a voltage breakdown between the first and second probe members 14a and 14b. In one embodiment, one of the first and second probe members 14a and 14b is a high voltage probe and another of the first and second probe members 14a and 14b is a low voltage probe.

As shown in FIG. 5, each probe member 14 comprises a tip portion 141. During testing, the tip portions 141 of the probe members 14 contact corresponding pads 51 of a device 5 being tested.

As shown in FIG. 5, in one embodiment, the insulation member 15 is located or positioned at a location between the tip portions 141 of the first and second probe members 14a and 14b.

In one embodiment, the insulation member 15 is applied to prevent the occurrence of an electrical breakdown between the probe members 14. In one embodiment, the insulation member 15 is applied to further prevent the occurrence of an electrical breakdown between pads on the device 5 being tested.

The insulation member 15 is used to increase the electrical insulation between the first and second probe members 14a and 14b. The insulation member 15 is configured to prevent ultra-high probe-to-probe and/or pad-to-pad voltage breakdowns occurring at a voltage of greater than 3.3V/μm (air dielectric breakdown) and possibly of up to 30V/μm (micrometer) depending on the isolation material in use. In one embodiment, after the placement of the insulation member 15, the breakdown voltage between the first and second probe members 14a and 14b is up to 10V/um. The insulation member 15 can be made of any high isolation material that can be processed for fine features and of a dielectric breakdown that is greater than air (>3.3V/μm).

In one embodiment, the insulation member 15 can be attached to the testing device 1 or the circuit board 12 such that the insulation member 15 can be moved vertically with the probe members 14. In one embodiment, the insulation member 15 can be attached to the testing device 1 or the circuit board 12, and adjustable relative to the probe members 14 so that the tip portions 141 of the probe members 14 can protrude beyond the insulation member 15 or not protrude beyond the insulation member 15. In one embodiment, the insulation member 15 can move or be positioned independently of the probe members 14.

In one embodiment, the insulation member 15 can contact the device 5 being tested during the testing. In one embodiment, the front end of the insulation member 15 is between corresponding pads of the device 5 being tested when the insulation member 15 contacts the device 5 being tested. In one embodiment, the insulation member 15 does not contact the device 5 being tested during the testing.

In one embodiment, the insulation member 15 is made of a soft material. In one embodiment, the soft material comprises polymer, such as silicone or polytetrafluoroethylene. In one embodiment, the insulation member 15 made of a soft material is decompressed or deformable when the insulation member 15 contacts the device 5 being tested during the testing.

In one embodiment, the insulation member 15 is made of a hard material, such as ceramic.

Referring to FIG. 5, the testing device 1 may comprise an actuator 16. The actuator 16 may comprise a shaft 161, a supporting member 162 for supporting the shaft 161, and a driving device connecting to the shaft 161. The shaft 161 connects to the insulation member 15. The driving device is configured to move the shaft 161 so that the insulation member 15 can move or be positioned close to or away from the device 5 being tested. In one embodiment, the driving device comprises a threaded rod mechanism. In one embodiment, the driving device is manually operated. In one embodiment, the driving device comprises a motor, a controller, and a linear motion mechanism.

Figure 6:
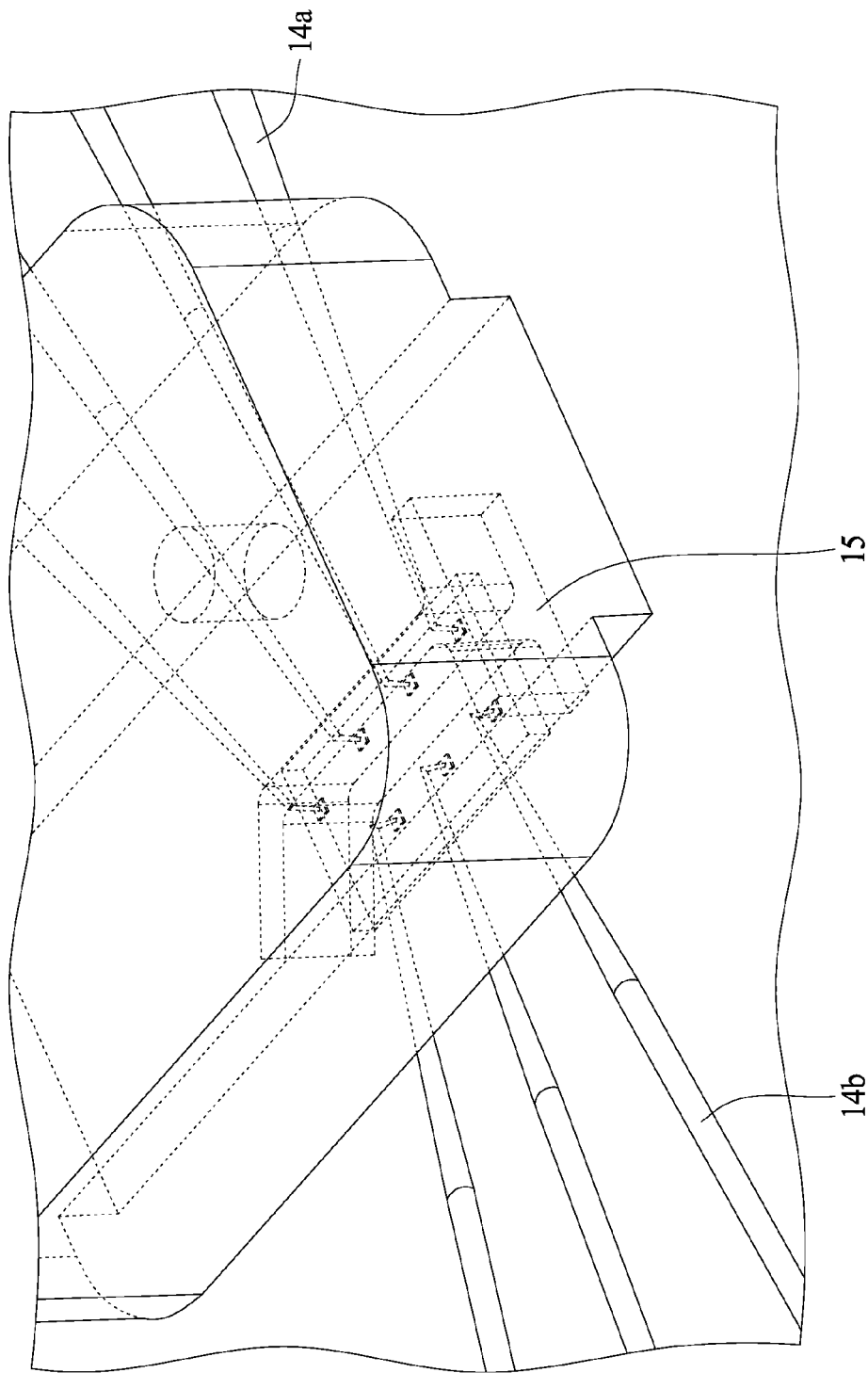
FIGS. 6 and 7 show an insulation member according to one embodiment of the present invention.
Figure 7:
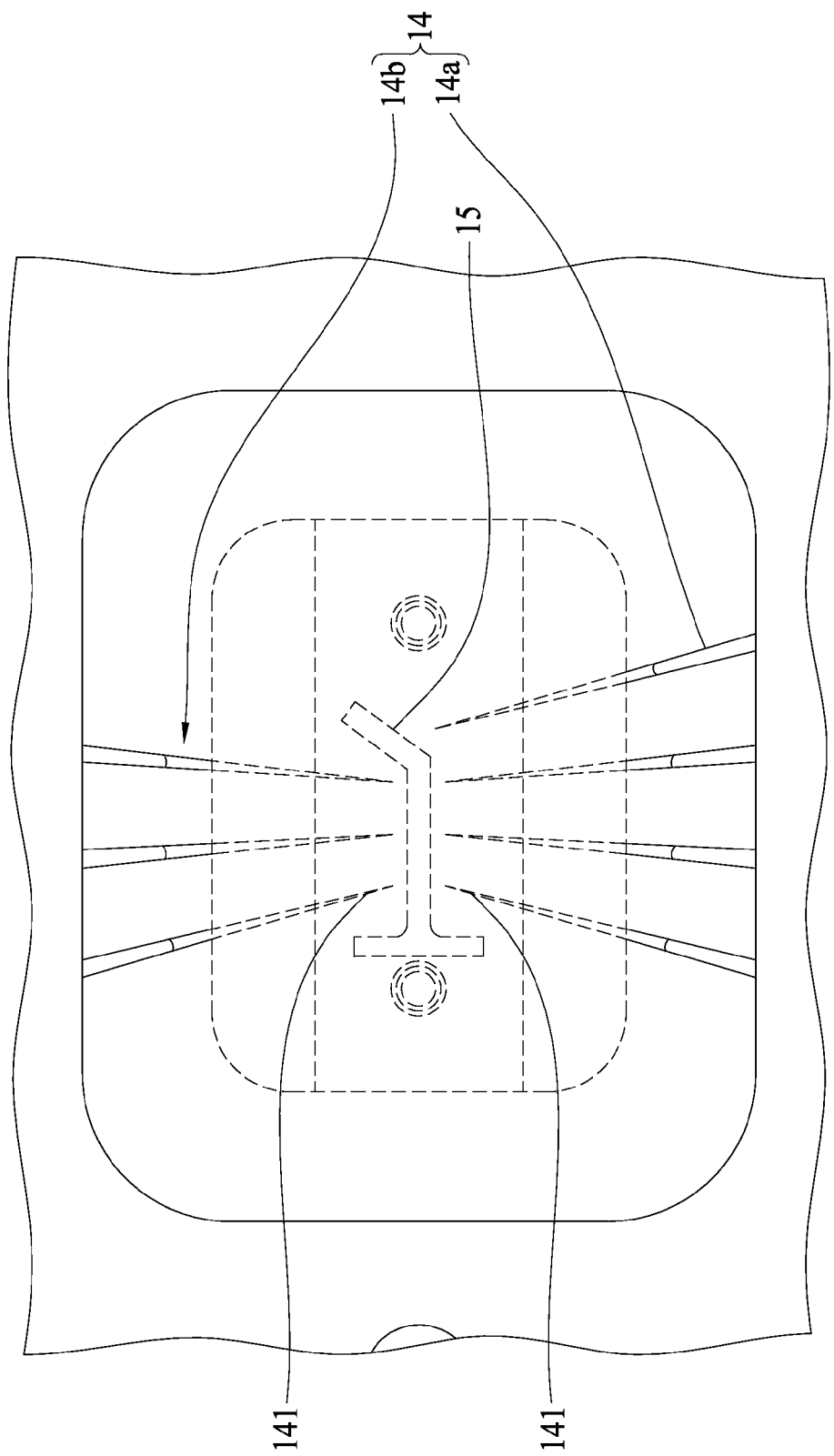

FIGS. 6 and 7 show an insulation member 15 according to one embodiment of the present invention. The insulation member 15 can be designed according to the arrangement of the probe members 14. The testing device 1 may comprise a plurality of first probe members 14a and a plurality of second probe members 14b. The insulation member 15 may extend between the tip portions 141 of the first probe members 14a and the tip portions 141 of the second probe members 14b. In one embodiment, the tip portions 141 of the first probe members 14a are arranged in a line and along a first side of the insulation member 15, and the tip portions 141 of the second probe members 14b are arranged in a line and along a second side of the insulation member 15, wherein the first and second sides can be, but do not necessarily need to be, opposite to each other.

The insulation member 15 can be configured to extend in front of and at one side of a group of probe members 14. In one embodiment, as shown in FIG. 7, the insulation member 15 extends in front of and at one side of the first probe members 14a.

The insulation member 15 can be configured to extend in front of and at two sides of a group of probe members 14. In one embodiment, as shown in FIG. 7, the insulation member 15 extends in front of and at two sides of the second probe members 14b, which are high voltage probes.

The insulation member 15 may comprise at least one plate element. The insulation member 15 may comprise at least one straight plate element. The insulation member 15 can be partially curved. The insulation member 15 can be configured to partially surround a group of probe members 14. The insulation member 15 can be configured to comprise a plurality of plate elements, which extend along different directions parallel to the circuit board 12.

The insulation member 15 may have a bottom portion that has a size different from an upper portion of the insulation member 15 connecting to the testing device 1 or the circuit board 12. The insulation member 15 may be tapered along a direction from the circuit board 12 toward a device being tested.

In at least some embodiments of the present invention, a method for testing a circuit, or integral circuits, is provided. In the method, first and second probe members are moved to contact a device being tested. In one embodiment, one of the first and second probe members is a high voltage probe and another is a low voltage probe.

A breakdown voltage between the first and second probe members is increased by employing an insulation member. In one embodiment, the insulation member is moved or positioned between the tip portions of the first and second probe members after the first and second probe members contact the device being tested. In one embodiment, the insulation member is originally disposed between the tip portions of the first and second probe members, and the insulation member moves simultaneously when the first and second probe members move. In one embodiment, the insulation member moves first, and then the first and second probe members move.

In one embodiment, the insulation member is positioned between pads that respectively contact the first and second probe members. In one embodiment, the insulation member is positioned against the device being tested. In one embodiment, the insulation does not contact the device being tested.

It will be apparent to those skilled in the art that various modifications can be made to the disclosed embodiments. It is intended that the specification and examples be considered as exemplary only, with the true scope of the disclosure being indicated by the following claims and their equivalents.

What is claimed is:

1. A testing device comprising:
    a first probe member comprising a first tip portion for contacting a device being tested;
    a second probe member comprising a second tip portion for contacting the device being tested;
    a mobile insulation member located between said first and second tip portions and capable of independent movement with respect to said first and second tip portions and said device being tested during testing, wherein the insulation member is free of air.

2. The testing device of claim 1, wherein the insulation member contacts the device being tested during testing.

3. The testing device of claim 1, wherein the insulation member is configured to increase a breakdown voltage between the first and second probe members to greater than 3.3V/$\mu$m.

4. The testing device of claim 1, wherein the insulation member comprises a soft material or a hard material.

5. The testing device of claim 1, wherein the insulation member comprises ceramic, polytetrafluoroethylene, or silicone.

6. The testing device of claim 1, further comprising an actuator configured to move the insulation member.

7. The testing device of claim 6, wherein the actuator moves the insulation member against the device being tested when the first and second probe members contact the device being tested and before a testing is performed.

8. A testing device comprising:
    a first probe member comprising a first tip portion for contacting a device being tested;
    a second probe member comprising a second tip portion for contacting the device being tested;
    a mobile insulation member located between said first and second tip portions and capable of independent movement with respect to said first and second tip portions and said device being tested when a testing is performed, wherein the insulation member is free of air.

9. The testing device of claim 8, wherein the insulation member is positioned to contact the device being tested during testing.

10. The testing device of claim 8, wherein the insulation member is configured to increase a breakdown voltage between the first and second probe members to greater than 3.3V/$\mu$m.

11. The testing device of claim 8, wherein the insulation member comprises a soft material or a hard material.

12. The testing device of claim 8, wherein the insulation member comprises ceramic, polytetrafluoroethylene, or silicone.

13. The testing device of claim 8, further comprising an actuator configured to position the insulation member.

14. The testing device of claim 13, wherein the actuator moves the insulation member against the device being tested when the first and second probe members contact the device being tested and before the testing is performed.

15. A method for testing a circuit, comprising:
    moving first and second probe members to contact a device being tested; and
    increasing a breakdown voltage between the first and second probe members by moving a mobile insulation member which moves independently with respect to said first and second probe member and said device being tested during testing, wherein the insulation member is free of air.

16. The method of claim 15, wherein the steps of moving and increasing are performed simultaneously.

17. The method of claim 15, wherein the insulation member is positioned against the device being tested.

18. The method of claim 15, wherein the insulation member is configured to increase the breakdown voltage to greater than 3.3V/$\mu$m.

19. The method of claim 15, wherein the insulation member comprises a soft material or a hard material.

* * * * *